United States Patent
Lanio

(10) Patent No.: US 6,627,890 B2
(45) Date of Patent: *Sep. 30, 2003

(54) PARTICLE BEAM APPARATUS FOR TILTED OBSERVATION OF A SPECIMEN

(75) Inventor: Stefan Lanio, Erding (DE)

(73) Assignee: Advantest Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/535,030

(22) Filed: Mar. 24, 2000

(65) Prior Publication Data

US 2003/0010926 A1 Jan. 16, 2003

(30) Foreign Application Priority Data

Mar. 31, 1999 (EP) .............................. 99106653

(51) Int. Cl.⁷ .............................. H01J 37/00; H01J 9/26
(52) U.S. Cl. .................. 250/311; 250/310; 250/398; 250/396 R; 250/396 ML; 250/492.1; 250/306; 250/307; 250/308; 313/444
(58) Field of Search ................................. 250/310, 311, 250/396 ML, 396 R, 398, 492.1, 305, 306, 307, 308; 313/444

(56) References Cited

U.S. PATENT DOCUMENTS

| | | | |
|---|---|---|---|
| 4,426,577 A | * 1/1984 | Koike et al. | 250/310 |
| 4,434,367 A | * 2/1984 | Yonezawa | 250/311 |
| 4,896,036 A | * 1/1990 | Rose et al. | 250/310 |
| 4,962,313 A | * 10/1990 | Rose | 250/311 |
| 4,963,748 A | * 10/1990 | Szilagyi | 250/396 R |
| 5,221,844 A | * 6/1993 | van der Mast et al. | 250/398 |
| 5,258,617 A | * 11/1993 | Kaneyama et al. | 250/311 |
| 5,483,073 A | * 1/1996 | Benner | 250/311 |
| 5,510,617 A | * 4/1996 | Troost et al. | 250/310 |
| 5,578,822 A | * 11/1996 | Van Der Mast et al. | 250/310 |
| 5,892,224 A | * 4/1999 | Nakasuji | 250/310 |
| 5,894,124 A | * 4/1999 | Iwabuchi et al. | 250/310 |
| 6,531,697 B1 | * 3/2003 | Nakamura et al. | 250/311 |

* cited by examiner

*Primary Examiner*—John R. Lee
*Assistant Examiner*—David A. Vanore
(74) *Attorney, Agent, or Firm*—Muramatsu & Associates

(57) ABSTRACT

A particle beam apparatus for tilted observation of a specimen is capable of producing magnification images of the specimen under tilted observation with high accuracy. The particle beam apparatus includes a source for generating a particle beam, deflection means for tilting the particle beam and a lens for focussing the tilted particle beam onto the specimen. Furthermore, multipole correction means are provided for correcting the lens aberrations occurring due to off-axial intersection of the lens by the tilted particle beam. The lens is an electrostatic, magnetic or combined electrostatic-magnetic objective lens.

14 Claims, 6 Drawing Sheets

PARTICLE BEAM APPARATUS FOR TILTED OBSERVATION OF A SPECIMEN

FIELD OF THE INVENTION

The invention relates to a particle beam apparatus for tilted observation of a specimen which is capable of producing magnified images of the specimen under test with high accuracy.

BACKGROUND OF THE INVENTION

Three-dimensional optical inspection and measurement of microscopic structures requires tilting of the beam axis with respect to the specimen surface. Known microscopes either use specimen tilt stages or mechanical tilting of the optical column. However, these methods have the following severe drawbacks: low throughput, large masses have to be accelerated and decelerated, mechanical drift, particle generation.

Furthermore, beam tilt is known from stereoscopic imaging techniques and convergent beam illumination techniques. However, since optical performance of a standard particle optical lens deteriorates quickly with increasing beam tilt angle, stereo microscopy is only feasible at relatively low magnification.

SUMMARY OF THE INVENTION

The object of the invention, therefore, is to provide a particle beam apparatus for tilted observation of a specimen which is capable of producing high magnification images of the specimen under tilted observation with optical resolution comparable to axial performance.

According to the invention, this object is achieved by the features of the present invention in that a multipole correction means is provided for correcting the lens aberrations occurring due to off-axial intersection of the lens by the tilted particle beam.

Further embodiments of the invention are also disclosed which further improve the performance of the particle beam apparatus.

FIG. 2 shows the influence of the spherical aberration in the particle beam apparatus occurring due to off-axial intersection of the lens by the tilted particle beam. A particle beam 1 is generated in a source 2 and is tilted by the deflection means 3 before the tilted particle beam 1a off-axially intersects a lens 4 which focusses the tilted particle beam 1a onto a specimen 5.

The lens 4 is an electrostatic, magnetic or combined electrostatic-magnetic objective lens. The refractive power of such a lens is too large for an off-axial beam. The off-axial beam forms a large spot 1b on the specimen 5. Even if the refractive power of the lens is reduced, the beam cannot be focussed into a small spot (comparable in size to the actual beam diameter) due to the cubic dependency of spherical aberrations on the tilt angle α.

FIG. 3 shows the influence of the chromatic aberration in the particle beam apparatus occurring due to off-axial intersection of the lens by the tilted particle beam 1a. The refractive power of the lens 4 depends on the energy of the off-axial beam. Only electrons with the mean beam energy $E_o$ are correctly focussed into a small spot on the specimen. Electrons with a lesser energy $E_O-\Delta E$ are focussed above the specimen plane and form a large spot on the specimen. Electrons with a larger energy $E_O+\Delta E$ are focussed (virtually) below the specimen plane and also form a large spot on the specimen. As a result, an elongated aberration figure is formed on the specimen and the beam cannot be focussed into a small spot (comparable in size to the actual beam diameter).

In order to correct one or both lens aberrations described in FIGS. 2 and 3, the invention proposes multipole correction means for correcting the lens aberrations occurring due to the off-axial intersection of the lens by the tilted particle beam.

In one embodiment, the correction means comprise at least eight pole elements for correcting the spherical aberration, and in another embodiment, the correction means comprise at least four electrostatic and four magnetic pole elements for correcting the chromatic aberration. In a third embodiment, both correction means are combined to correct the spherical as well as the chromatic aberration.

Further embodiments and advantages of the invention are explained in greater detail below with reference to the drawings.

DETAILED DESCRIPTION OF THE INVENTION

Figure 1:
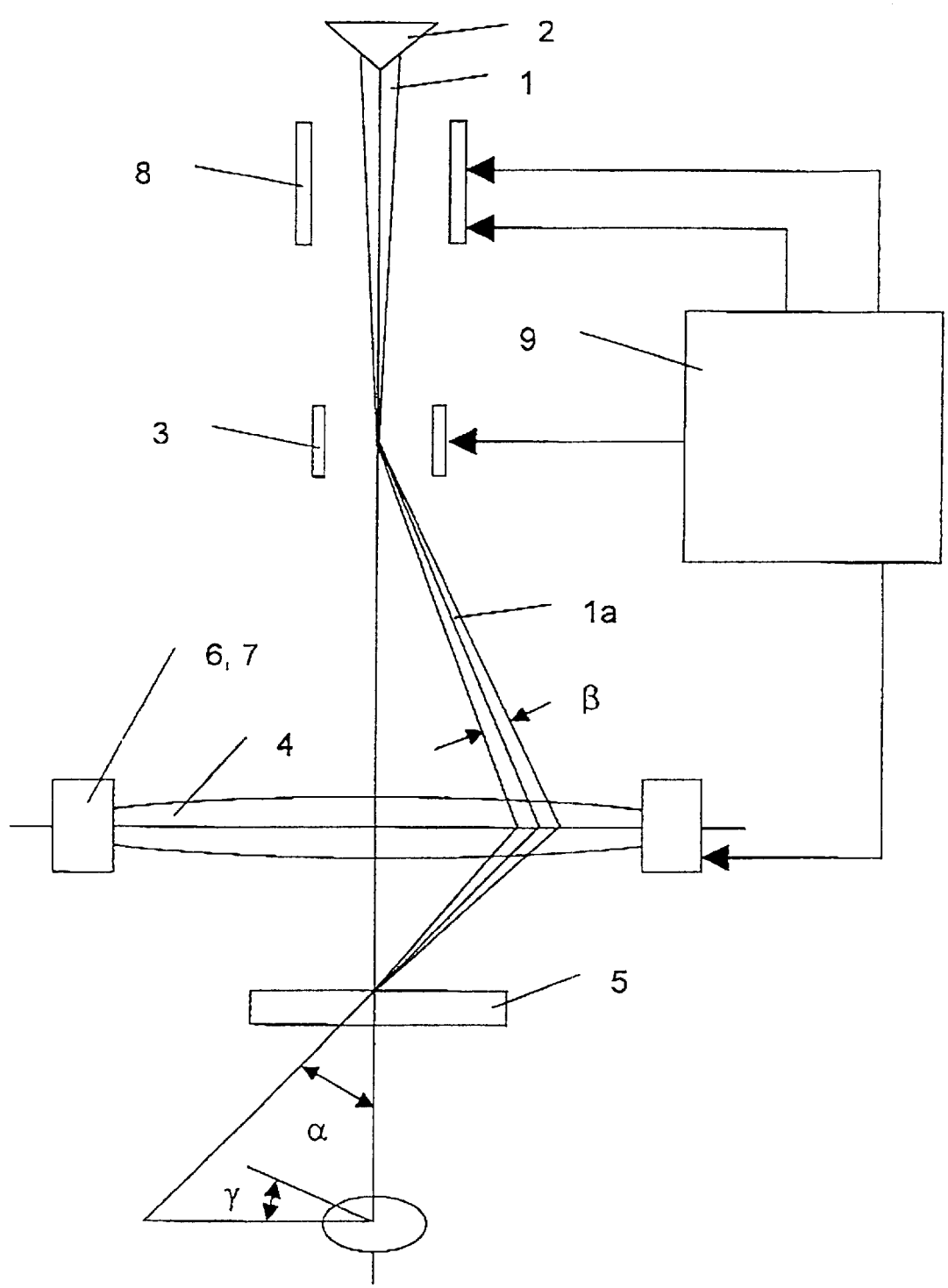
FIG. 1 shows a schematic representation of a particle beam apparatus for tilted observation with correction means.

FIG. 1 shows a particle beam apparatus, preferably a scanning electron microscope, for tilted observation of the specimen 5, comprising a source 2 for generating a particle beam 1, deflection means 3 for tilting the particle beam and a lens 4 for focussing the tilted particle beam 1a onto the specimen 5. Furthermore, there are multipole correction means 6, 7 for correcting the lens aberrations occurring due to off-axial intersection of the lens 4 by the tilted particle beam 1a.

The correction means 6, 7 are arranged in the region of the lens 4 and are preferably positioned coaxially with the optical axis of the lens 4. The correction means can be adjusted coaxially with the optical axis by applying appropriate voltages/currents.

The deflection means 3 is —in the direction of the particle beam —positioned in front of the lens 4. Accordingly, the tilted beam with an aperture angle β will intersect the lens 4 in an off-axial position. The lens 4 will focus this tilted beam 1a onto the specimen 5 and, accordingly, it will be possible to observe the specimen 5 at a tilt angle α. The rotation angle γ and the tilt angle α of the tilted particle beam 1a can be selected by the deflection means 3.

Figure 2:
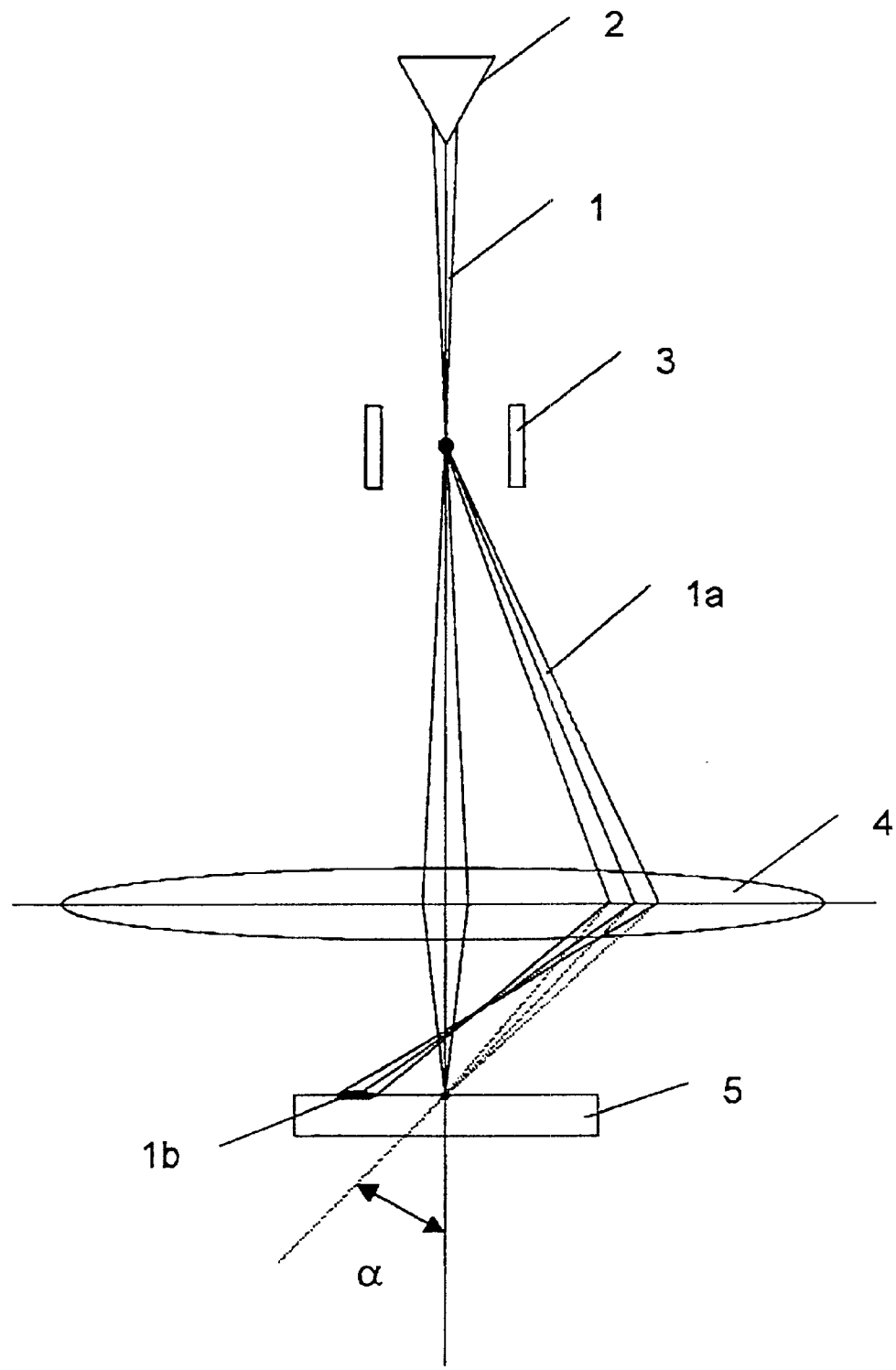
FIG. 2 shows a schematic representation of a particle beam apparatus showing the influence of spherical aberration.
Figure 3:
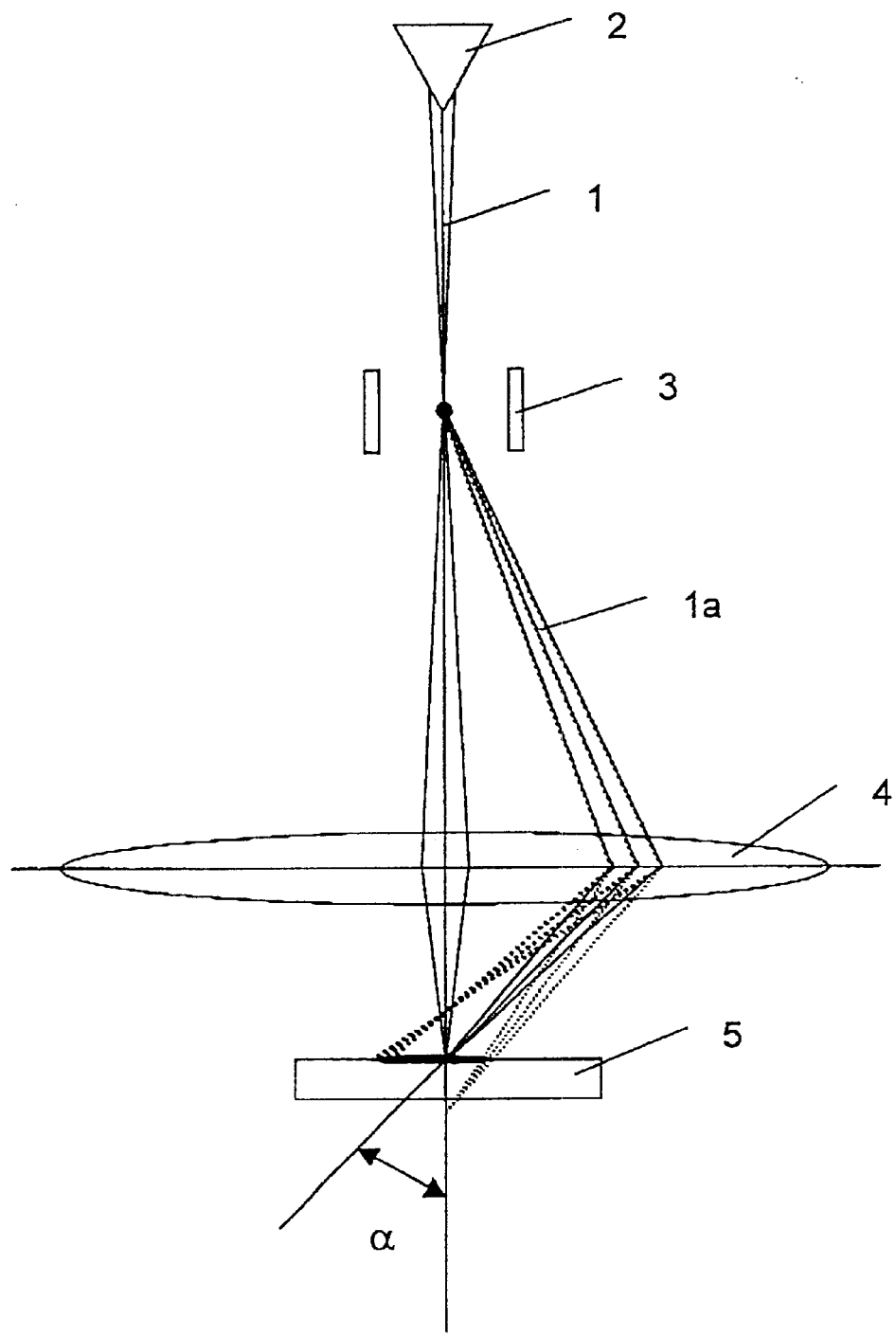
FIG. 3 shows a schematic representation of a particle beam apparatus showing the influence of chromatic aberration.

The off-axial intersection of the tilted particle beam 1a raises the problem of spherical and/or chromatic aberration influence. In order to avoid the aberration influences described above with reference to FIGS. 2 and 3, multipole correction means 6, 7 are provided.

Figure 4:
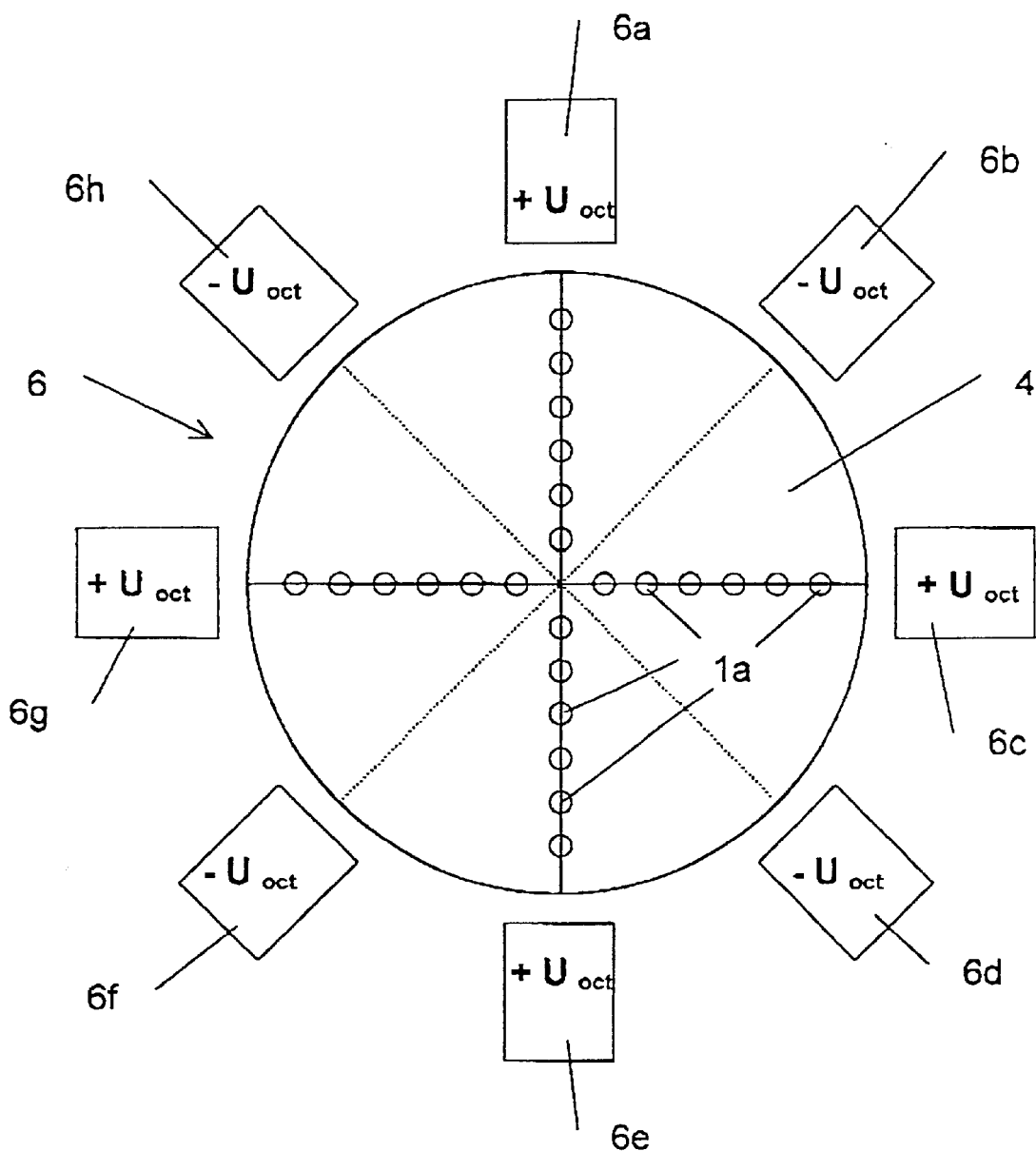
FIG. 4 shows a schematic top view of the correction means for correcting the spherical aberration.
Figure 5:
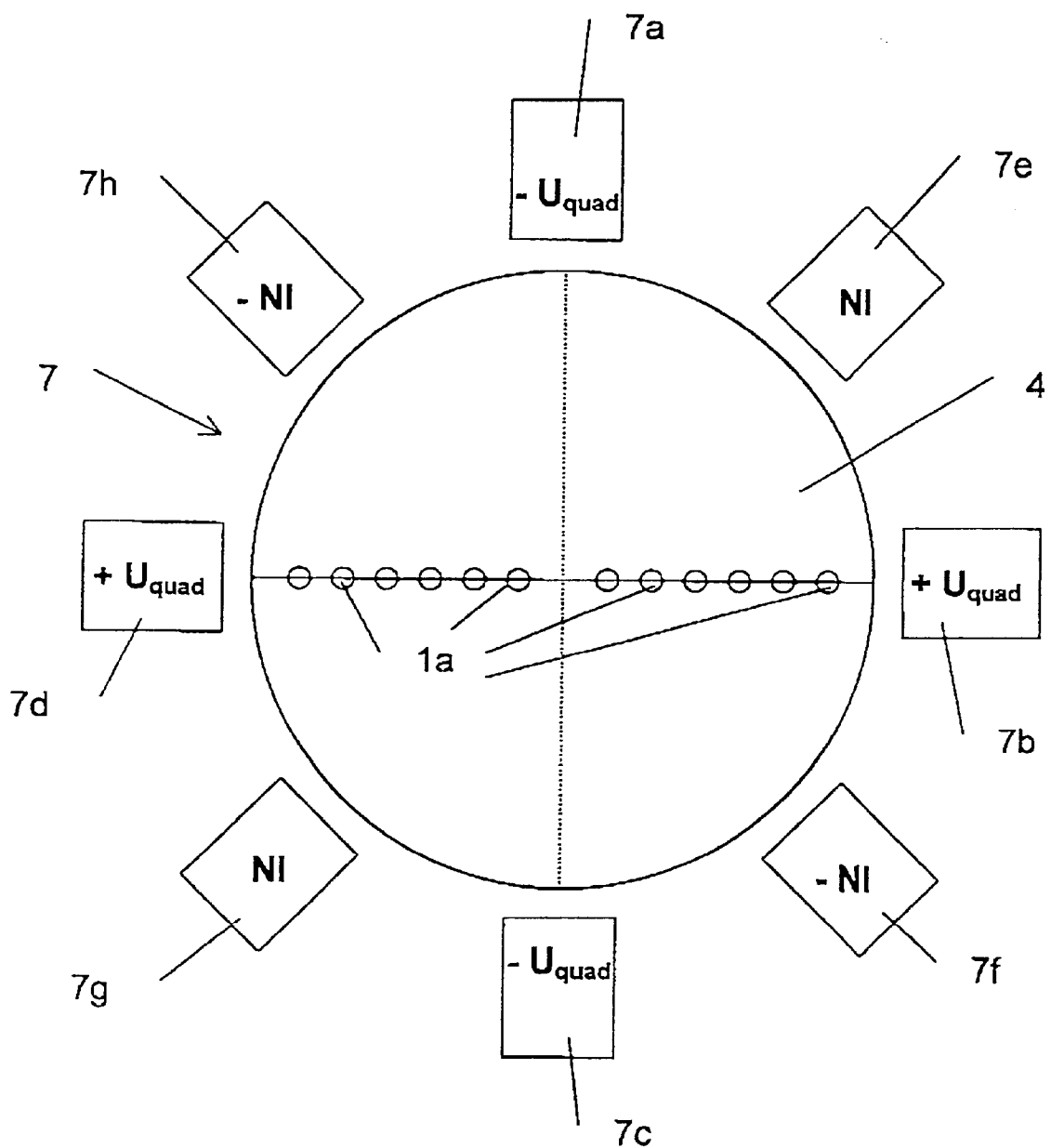
FIG. 5 shows a schematic top view of the correction means for correcting the chromatic aberration.
Figure 6:
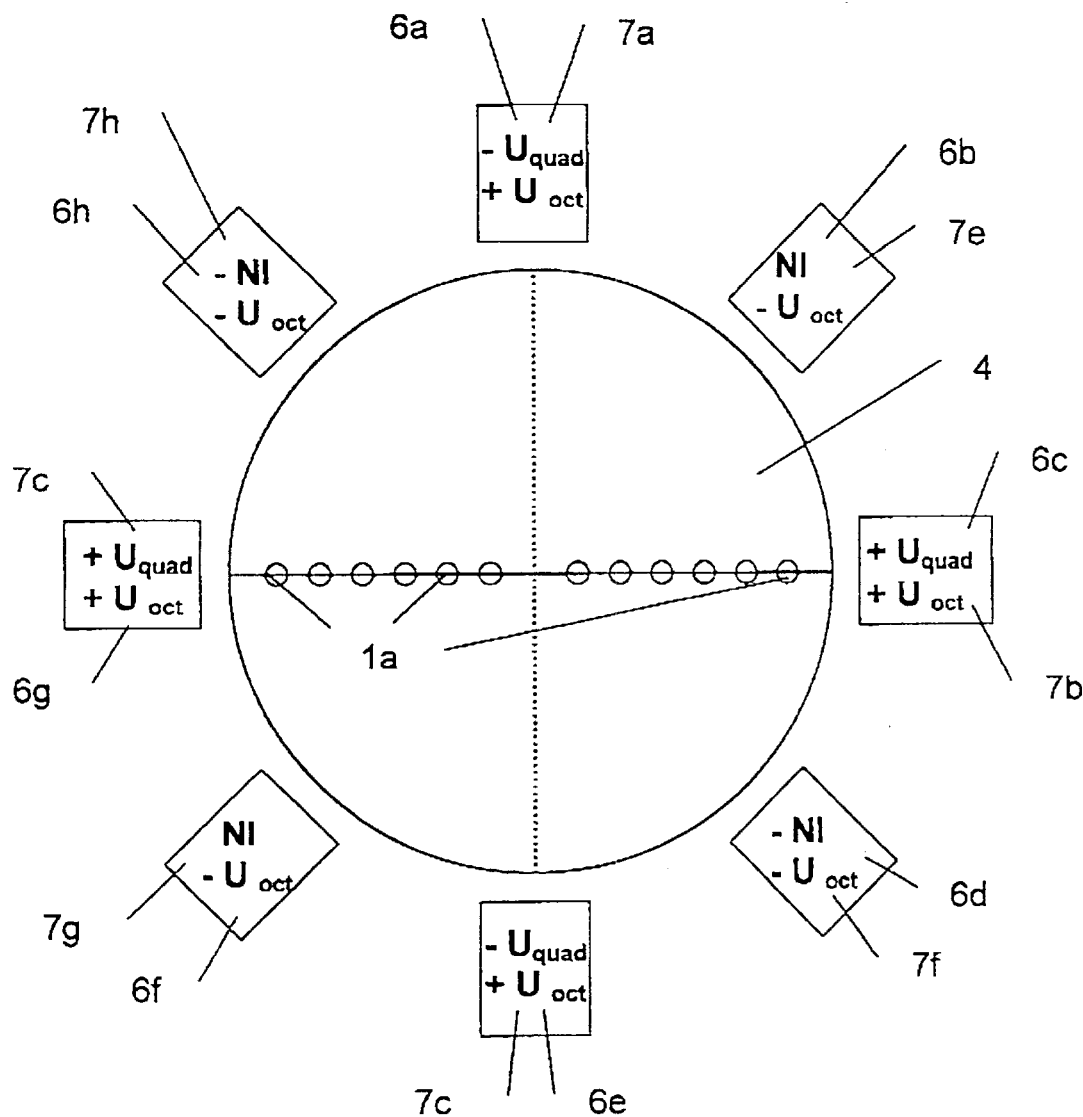
FIG. 6 shows a schematic top view of the correction means for correcting the spherical as well as the chromatic aberration.

With reference to FIGS. 4, 5 and 6, three different embodiments of these correction means will be described in more detail.

The embodiment according to FIG. 4 is preferred if the optical performance of the system is mainly limited by spherical aberration which, for example, may arise in apparatuses with high acceleration voltage, low energy width and/or the use of a monochromator.

The correction means 6 shown in FIG. 4 comprises eight pole elements 6a–6h for correcting the spherical aberration. All these eight pole elements generate an octupole field.

Since the off-axial beam penetrates only a small off axial area of the lens 4, it is sufficient to correct spherical aberration locally within this area. This can be achieved by means of a single octupole element as shown in FIG. 4. This element is arranged co-axially with the lens 4. Its orientation (direction of maximum field strength) coincides with the direction in which the beam 1a has been shifted, taking into account the effect of Larmor rotation, if present. Its amplitude is chosen such that the spherical aberration coefficient of the lens 4 is cancelled by the spherical aberration contribution of the octupole. It should be noted that the necessary excitation of the multipole correction means 6 is independent of the tilt angle $\alpha$ of the particle beam.

The multipole fields can be either electrostatic (as shown in FIG. 4), magnetic or a combination thereof. The axial position of the multipole correction means may be in front of, inside or behind the lens 4.

Since the octupole element exactly cancels the spherical aberration in two perpendicular sections, it is possible to rotate the tilted beam 1a in 90° steps about the optical axis, thereby imaging the specimen from four sides. The possible areas of intersection of the particle beam with the lens 4 are indicated by small circles in FIG. 4. If the polarity of the octupole is alternated, the beam may be tilted along the dotted lines, thus producing a total of eight different viewing angles for an octupole element formed by eight poles. If continuous rotation is required, the octupole field must be formed by a higher number of poles (e.g. sixteen) so that the field orientation can be continuously rotated together with the beam.

If the optical performance of the system is only limited by chromatic aberration (e.g. low acceleration voltage, high energy width) a multipole correction means is preferable, which is disclosed in FIG. 5.

The correction means 7 shown in FIG. 5 comprises four electrostatic pole elements 7a–7d and four magnetic pole elements 7e–7h for correcting the chromatic aberration. The correction means 7 is adapted to generate a quadrupole field.

Since the off-axial particle beam penetrates only a small off-axial area of the lens 4, it is sufficient to correct chromatic aberration locally within this area. This can be achieved by means of a single combined electrostatic-magnetic quadrupole element as shown in FIG. 5. This element is arranged co-axially with the imaging round lens 4. Its orientation (direction of maximum field strength) coincides with the direction in which the beam has been shifted, taking into account the effect of Larmor rotation, if present. Its amplitude is chosen according to two conditions:

the focussing action of the electrostatic quadrupole and the magnetic quadrupole are cancelled out; this determines their relative field strength;

the chromatic aberration contribution of the combined electrostatic-magnetic quadrupole cancels the chromatic aberration of lens 4; this determines the absolute field strength.

It should be noted that the necessary excitation of the combined electrostatic-magnetic quadrupole is independent of the tilt angle of the beam.

The axial position of the quadrupoles may be in front of, inside or behind the lens 4.

The chromatic aberration of the off-axial beam is corrected in one section of the optical system. The useful combinations of tilt angles and rotation angles of the beam are indicated by small circles in FIG. 5, which show the intersection area of the particle beam with lens 4. If the polarity of the quadrupole is alternated, the beam may be tilted along the dotted line.

Since the combined electrostatic-magnetic quadrupole exactly cancels the lens aberrations in one section, it is possible to rotate the tilted beam by 180° about the optical axis, thereby imaging the specimen 5 from two sides. If the polarity of the quadrupoles is alternated, a total of four different viewing angles is possible. If continuous rotation is required, the quadrupole fields must be formed by a higher number of poles (e.g. eight magnetic and eight electric poles) so that the field orientation can be continuously rotated together with the beam.

For systems which suffer from both limitations, i.e. spherical as well as chromatic aberration, the two compensation techniques described in FIGS. 4 and 5 can be applied simultaneously. An advantageous optical design of these correction means is disclosed in FIG. 6.

FIG. 6 shows a combined electrostatic-magnetic quadrupole and octupole correction element. Chromatic aberration and spherical aberration of the off-axial beam are corrected simultaneously in one section of the optical system. The useful combinations of tilt angle a and rotation angle $\gamma$ of the particle beam are indicated by small circles, which show the area of intersection of the particle beam with the lens 4. If the polarity of the quadrupole is alternated, the beam may be tilted along the dotted section.

The amplitude of the quadrupole and octupole excitations depends only on the chromatic and spherical aberration coefficient of the lens, not on the tilt angle. A higher number of pole elements can be used to generate quadrupole and octupole fields which can be rotated about the optical axis. Thereby it is possible to obtain correction along a section which can be orientated arbitrarily.

In the embodiments according to FIGS. 4, 5 and 6, the spherical and/or chromatic aberration correction is only achieved locally within a small circular area around the tilted beam axis. For larger aperture angles of the beam, astigmatism is introduced. This astigmatism can be corrected as usual by means of a rotatable quadrupole stigmator 8 as shown in FIG. 1. For reasons of simplicity, this stigmator 8 should be arranged co-axially with the untilted axis in front of the deflection means 3.

If the stigmator 8 is arranged in the region of the lens 4, it will be necessary to shift the center of the stigmator electromagnetically to the axis of the tilted particle beam 1a. This, however, is much more difficult to implement.

The stigmator 8 can also be used to simultaneously correct the overall parasitic astigmatism of the optical system.

The particle beam apparatus according to FIG. 1 further comprises control means 9, which are connected to the deflection means 3, multipole correction means 6, 7 and stigmator 8 in order to control the multipole correction means 6, 7 and the stigmator 8 in synchronism with the deflection means 3.

At still larger aperture angles $\beta$ of the tilted beam 1a, parasitic dipole and hexapole fields are observed. Their effect can be cancelled by appropriate correction fields. The dipole fields should preferably be generated by the multipole correction means 6, 7 itself. The rotatable hexapole stigmator field should preferably be generated in front of the deflection means 3, e.g. together with the quadrupole stigmator field. The rotation angle γ and the tilt angle a of the particle beam 1 can be selected by the deflection means 3 in front of the lens 4.

Preferably, for the sake of simplicity of the system, a crossover of the particle beam is formed inside the deflection means 3. Otherwise, beam deflection would introduce an unwanted beam shift in the image plane. This shift could, of course, also be compensated by an additional dipole field that could easily be generated elsewhere, e.g. in the multipole correction means itself.

The multipole correction means described above will decisively reduce the aberrations resulting from a tilted particle beam, thereby improving optical resolution to a value comparable to the axial resolution of a particle beam.

What is claimed is:

1. A particle beam apparatus for tilted observation of a specimen, comprising:

a source for generating a primary particle beam to irradiate the specimen, deflection means for tilting the primary particle beam from the source by a predetermined tilt angle, a lens which receives the primary particle beam having the predetermined tilt angle (tilted primary particle beam) in a manner of off-axial intersection for focussing the tilted primary particle beam onto the specimen, and multipole correction means for correcting lens aberrations occurring due to the off-axial intersection of the lens by the tilted primary particle beam;

wherein said multipole correction means is provided at an outer periphery of the lens, and wherein said deflection means is provided between the source and the lens, thereby providing the tilted primary particle beam to the lens.

2. A particle beam apparatus according to claim 1, wherein the multipole correction means includes at least eight pole elements for correcting spherical aberrations of the lens.

3. A particle beam apparatus according to claim 2, wherein the multipole correction means are adapted to generate an octupole field.

4. A particle beam apparatus according to claim 2, wherein the multipole correction means are adapted to generate the rotatable octupole field.

5. A particle beam apparatus according to claim 1, wherein the multipole correction means includes at least four electrostatic and at least four magnetic pole elements for correcting chromatic aberrations of the lens.

6. A particle beam apparatus according to claim 5, wherein the multipole correction means are adapted to generate a quadrupole field.

7. A particle beam apparatus according to claim 1, wherein the multipole correction means includes electrostatic and/or magnetic pole elements.

8. A particle beam apparatus according to claim 1, wherein the multipole correction means are arranged co-axially with an optical axis of the lens.

9. A particle beam apparatus according to claim 1, wherein the deflection means are arranged in a crossover of the particle beam.

10. A particle beam apparatus according to claim 1, further comprising a stigmator for correcting parasitic axial astigmatism of the tilted particle beam.

11. A particle beam apparatus according to claim 10, wherein the stigmator is arranged co-axially with an untilted particle beam between the source and the deflection means.

12. A particle beam apparatus according to claim 1, further comprising control means for controlling the multipole correction means in synchronism with the deflection means.

13. A particle beam apparatus according to claim 10, further comprising control means for controlling the stigmator and the multipole correction means in synchronism with the deflection means.

14. A particle beam apparatus according to claim 1, wherein the multipole correction means includes first correction means for correcting chromatic aberrations of the lens and second correction means for correcting spherical aberrations of the lens.

\* \* \* \* \*